Nov. 14, 1972 R. A. LOWRY, JR., ET AL 3,702,787
METHOD OF FORMING OHMIC CONTACT FOR SEMICONDUCTING DEVICES
Filed Nov. 2, 1970

INVENTORS.
Billy E. Smith
Robert A. Lowry, Jr.
BY
Mueller & Aichele
ATTY'S.

United States Patent Office 3,702,787

Patented Nov. 14, 1972

3,702,787

METHOD OF FORMING OHMIC CONTACT FOR SEMICONDUCTING DEVICES

Robert Arthur Lowry, Jr., Phoenix, and Billy Eual Smith, Scottsdale, Ariz., assignors to Motorola, Inc., Franklin Park, Ill.

Filed Nov. 2, 1970, Ser. No. 85,965
Int. Cl. B44d *1/20;* C23b *5/62*
U.S. Cl. 117—213 5 Claims

ABSTRACT OF THE DISCLOSURE

There is disclosed an ohmic contact for silicon semiconducting devices in which the silicon is overlayed with a thin film of nickel-chromium followed by a thin film of nickel-chromium-silver over which is deposited a thick film of silver to complete the ohmic contact. A method for fabricating the ohmic contact is also disclosed.

Figure 1:
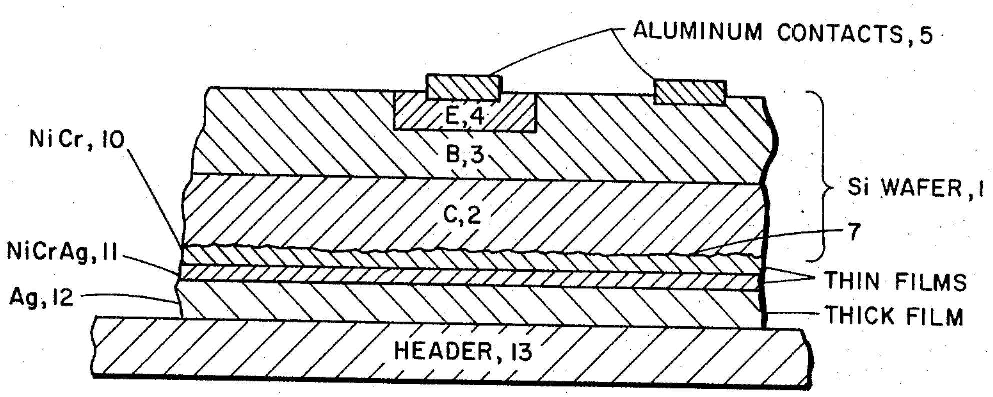

This invention relates to ohmic contacts for semiconductors and to a process for fabricating these contacts. More particularly this invention relates to a method of providing for metallization of the back of a wafer of semiconductive material to achieve greater current densities and reliability in high power application or when a large area of the semiconductor is to be coated with a conducting metal film. Such high power semiconducting devices include switches, amplifiers, rectifiers, SCR's triacs and diodes. Integrated circuits are among those devices having large areas which may be interconnected by the ohmic contact described herein.

This invention has particular application to the class of semiconductors which utilize silicon as the semiconductive material. Prior art silicon devices have used primarily "hard solder" techniques to achieve ohmic contacts, in which a thin film of gold is vacuum deposited on the silicon substrate. The entire device is then subjected to a heating process in which a eutectic of the gold and silicon is formed. This produces a large area ohmic contact for the silicon material. Problems have arisen, however, with the use of this "hard solder" technique. One of the problems most commonly encountered with high power silicon devices is the expansion and contraction of the silicon during various heating and cooling cycles. This expansion and contraction of the substrate causes fracture of the silicon device when a "hard solder" contact is used. In addition, this "hard solder" technique results in voids being formed across the area that is not wetted by the gold. These voids alter the resistance unevenly across the film which complicates calculation and delivery of the saturation voltage to the semiconducting device. The voids also cause fractures of the silicon when wire bonds are made to the device.

In addition to the nonuniformity of the electrical characteristics due to the voids, there is the problem of finding a metal which is sufficiently ductile, which will bond chemically to the silicon and which can form a eutectic bond at temperatures under 560° C. The 560° C. temperature is critical because it is at this temperature that the aluminum contacts normally used on the top side of the silicon devices form a eutectic with the silicon.

In the past it has been difficult to find a metal which will both produce a eutectic melt at temperatures under 560° C. while at the same time providing a "soft solder" in which the film deposited is elastic and not brittle.

The problem of finding such a material has led to the use of mechanical bonds in which metals having sufficient elasticity, but which are not chemically compatible with silicon, are mechanically bonded to the substrate by abrasion and hot pressing techniques. These contacts are characterized by frequent failure and nonuniform electrical characteristics due to the purely mechanical bonding structure. A metal which can provide such a mechanical bond, while at the same time having characteristics which allow its contraction and expansion with the contraction and expansion of the silicon substrate, is chromium. Unfortunately, however, chromium itself will not chemically bond to silicon at sufficiently low temperatures.

The present invention involves the use of a nickel-chromium alloy which forms a eutectic bond with silicon. The chromium in the alloy gives it ductility while the nickel permits chemical bonding with the silicon. The alloy not only is compatible chemically with the silicon but also forms a eutectic with the silicon at temperatures below 560° C. A nickel-chromium alloy is thus compatible with silicon and may be used with devices having aluminum contacts. This alloy also has a unique characteristic in that its ductility is compatible with the expansion and contraction characteristics of the silicon. On top of the nickel-chromium alloy deposition there is deposited a thin film of nickel-chromium-silver followed by the deposition of pure silver.

A three-stage deposition process is described in which a uniform deposition, free of voids, is obtained. The use of nickel-chromium and the three-layer technique provides a contact in which high current densities may be obtained and in which each layer contains a metal identical to that of an adjacent layer to provide a uniquely good ohmic contact from the outside layer to the silicon substrate. The contact obtained by the method described differs from prior art methods in that large areas of semiconductive material may be coated with a ductile eutectic ohmic contact having uniform electrical characteristics. Because an extensive area can be covered and because the final silver film may be a thick film compatible with high power uses, both high power semiconductors and large area integrated circuits using silicon wafers may be coated with an ohmic contact over the entire area. The contact thus produced is extremely reliable, has a high heat dissipation and offers controlled resistance across the back of the semiconductive wafer. It should be noted that the nickel-chromium film in no way functions as a resistive circuit element because of the three layer structure and the chemical constituents of these layers; and it is this resistance which is specifically avoided by the subject invention.

It is therefore an object of this invention to provide a wafer of semiconductive material with an improved ohmic contact.

It is a further object of this invention to provide a wafer of silicon semiconductive material with an improved ohmic contact in the form of a composite metallized backing film.

It is a still further object of this invention to provide a method for fabricating an improved ohmic contact extending across a large surface area of semiconductive material in which this contact includes at least one metallic thin film.

Figure 2:
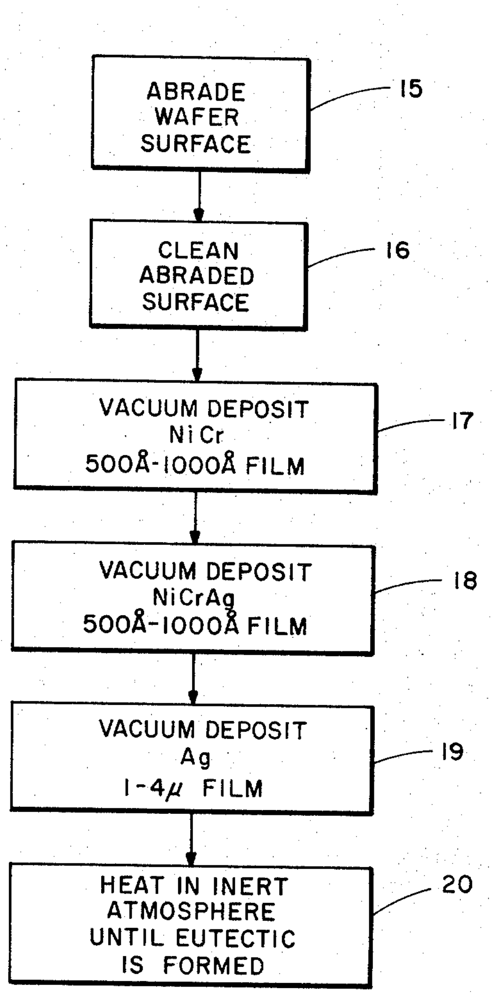

It is yet another object of this invention to provide a method for making an improved ohmic contact on a section of semiconductive material. Other objects of this invention will become more apparent from the following description used in connection with the accompanying drawings:

FIG. 1 is a cross-sectional view of a portion of a semiconductor wafer having an ohmic contact according to the invention; and FIG. 2 is a diagram showing the steps in one method for producing the ohmic contact shown in FIG. 1.

After the lapping and cleaning steps involved in the process of making a finished semiconducting device, a substantially completed wafer is formed. In the usual case, all that is required after the lapping and cleaning steps is metallization which is the deposition of a conductive backing material. This conductive backing material is usually deposited across the bottom surface or back of the entire wafer to make contact with the collector portion of the semiconductor material. After the backing has been applied and the entire device is tested, the wafer is scribed and broken into chips. A die bonding process, a wire bonding process, and an encapsulation process completes the semiconducting device.

It will be appreciated that in the metallization process a uniform backing film must be deposited over a substantial area. In the case of high powered devices this film must be able to withstand high temperatures and provide for high current densities which are usually on the order of one ampere per square or greater. In the case of integrated circuits, a large contact area is necessary in order to interconnect all of the subcomponents in the integrated circuit or to provide the integrated circuit with a common ground. It will therefore be appreciated that any silicon semiconducting device may be metallized with the subject contact.

A diagram of the completed semiconducting device is shown schematically in FIG. 1. In this diagram a typical silicon wafer 1 is shown with collector, base and emitter sections 2, 3 and 4 respectively. Aluminum contacts 5 are shown deposited on the emitter and base sections. As mentioned hereinbefore, the aluminum contacts form an undesirable eutectic bond with silicon at temperatures above 560° C. These aluminum contacts are in widespread use and it is this temperature which limits the curing temperature for the eutectic bonds to the semiconductor material.

The wafer in FIG. 1 is shown with an abraded lower surface 7, which is the result of lapping the semiconductor material. For purposes of this invention the "lapping" referred to is the coarse cutting of the semiconductor chip. Normally the coarse cutting operation is followed by polishing to provide a smooth surface, and it is the coarse cutting and polishing operation which is usually called "lapping." It is, however, the aforementioned coarse cutting which is referred to as "lapping" in this invention. It will be appreciated that the abrading in the lapping step referred to in this invention is not as severe as the abrading necessary to perform a purely mechanical bond between the metal film and the substrate. In fact, good ohmic contacts can be made to the silicon without any abrading whatsoever. The lapping does however add mechanical stability to the contact.

Deposited on the silicon substrate material is a nickel-chromium thin film layer 10. In this context "thin film" is defined to be a film of 100 angstroms to 1,000 angstroms thickness. In the preferred embodiment, this layer is from 500 to 1,000 angstroms thick or alternately has a resistance of 30 ohms per square ±10 ohms per square. Deposited immediately over the nickel-chromium film is another thin film 11 of nickel-chromium-silver. This film is also 500 to 1,000 angstrom units in thickness. A thick film 12 of silver is then deposited over the preceding two thin films. For the purposes of this invention, a "thick film" is defined to be one having a range of thicknesses from 1 to 10 microns. In the preferred embodiment, the thickness of this film is between one and four microns and may be varied to suit the particular application. In those high power semiconductor devices in which silicon is used, the determining factors of the thickness of the silver film are the power requirements of the device utilizing the metallization procedure of this invention, and the method and type of die bonding to the header. It will be appreciated that these films may be formed by other processes than vacuum deposition. These include plating and chemical deposition.

The semiconducting device, along with the contact composed of the thin and thick films, is shown mounted on a header 13 which is a metal base of Kovar, nickel, aluminum or even copper in some instances. The thick film may be welded or soldered to the header to provide the ohmic contact between the header and the silicon wafer.

After the films have been deposited a eutectic bond is formed by heating the entire semiconducting device. The heat is applied while the semiconducting device is in the vacuum deposition chamber. After vacuum deposition, the chamber is flooded with an inert gas so that oxidation during heating will not occur. Because of properties peculiar to the nickel-chromium alloy a eutectic bond to the silicon wafer can be obtained by heating the entire device at a temperature below 560° C. The eutectic bond may alternately be formed after the first deposition by introducing the inert gas at this point and heating the wafer and nickel-chromium film. The chamber must then be evacuated if further films are contemplated to provide the contact.

Typically the temperature range used in forming a eutectic bond between the subject contact and the silicon substrate is between 500° C. and 550° C. Because of the difficulty of maintaining the oven at a temperature just below 560° C., the 550° C. is considered a safe temperature which will not result in the deterioration of the aluminum contacts. A eutectic of nickel and silicon has been achieved but at temperatures far exceeding 560° C. While in the past, nickel has been bonded to silicon by an electroless chemical plating process, the nickel must then be sintered at between 600° C. and 800° C. in order to form the desired eutectically bonded contact. It will be apparent that the 600° C. to 800° C. temperature range for sintering would change the aluminum contacts and therefore limit the use of nickel alone in semiconducting devices using aluminum contacts unless the backing were deposited before the aluminum contacts were placed on the front side of the semiconductive device. It will also be appreciated that even if this prior art nickel-plated structure is used, other materials must be plated on the nickel in order to provide for good soldering contacts. The subject nickel-chromium alloy, which is deposited as a thin film, is eutectically bonded to the silicon at a much lower temperature than the sintered nickel. In addition, the nickel-chromium alloy has the unique characteristic of being ductile and can be deposited with a high degree of uniformity. This high degree of uniformity results in highly predictable electrical characteristics for the film across the entire deposited area. Since this film is deposited on the lapped portion of the wafer, increased ohmic contact is provided by the additional mechanical bond to the lapped structure.

The method steps for preparing the subject ohmic contact in the preferred embodiment are shown diagrammatically in FIG. 2. It will be appreciated that good ohmic contact involving only eutectic bonding may be obtained by eliminating the abrading and cleaning steps shown diagrammatically in boxes 15 and 16. Cleaning of the substrate surface, however, as shown by box 16 is necessary for a uniform eutectic bond if the silicon surface is abraded. The three vacuum deposition steps shown at 17, 18 and 19 may be accomplished in rapid succession by conventional vacuum deposition techniques.

In the preferred embodiment the nickel-chromium layer is first deposited as the 500 to 1,000 angstrom film as shown at box 17. The nickel-chromium alloy is available commercially from the Wilbur B. Driver Company having its principal place of business in Newark, N.J. under the trade name Nichrome 80–20. Analysis indicates that the proportions of the metals are 80% chromium and 20% nickel in the deposited film. While this specific alloy forms the preferred embodiment of the subject method, other alloys of nickel and chromium are contemplated as being within the scope of this invention. In this specific embodiment the nickel-chromium alloy is plated at 100 angstroms per second under a vacuum of $5\times10^{-5}$–$5\times10^{-6}$ torr. After the deposition of the nickel-chromium thin film, a nickel-chromium-silver blend is deposited as shown by box 18. The nickel-chromium-silver film in the preferred embodiment is deposited at 200 angstroms per second also under a vacuum of $5\times10^{-5}$–$5\times10^{-6}$ torr.

As is generally accepted in order to deposit a multi-metal blend, the nickel-chromium alloy may occupy one section of the vacuum deposition chamber while the silver is deposited from another section. Alternately each element may occupy a separate section and be simultaneously deposited with the other elements.

Following the second deposition step, a silver thick film is deposited as shown at box 19 to be a one to four micron film. This deposition is accomplished under a vacuum of $5\times10^{-5}$–$5\times10^{-6}$ torr at 500 angstroms per minute.

In the above three deposition steps the constituents have a purity of 99% or better. After the thick film of silver is deposited, an inert gas is introduced into the vacuum deposition chamber and the entire structure is heated until the eutectic bond is formed between the nickel and the silicon at the nickel-silicon interface. It is also possible that a silicon, nickel, chromium eutectic is formed simultaneously with the silicon-nickel eutectic at the silicon-nickel-chromium interface. In the preferred embodiment the inert gas is nitrogen and the temperature at which either of the eutectic bonds is formed is 550° C. The coated structure is heated at this temperature for 30 minutes in order that at least the silicon-nickel eutectic bond be formed. This heating step is shown at box 20.

In general a better eutectic bond is formed by heating the entire structure at the highest temperature possible without damaging the other components of the semiconductor for as long a time as possible. If the bottom surface of the semiconductor is first abraded, as referred to in the lapping operation, both a eutectic and mechanical bond is achieved between the nickel-chromium thin film and the silicon material. The entire triply overlayed ohmic contact is sufficiently ductile to follow the expansions and contractions of the silicon wafer through a variety of temperature conditions. Because the overlayed material follows the expansions and contractions of the silicon wafer, temperature swings of 500° C. or more can be accommodated. Finally, because of the uniformity of this contact, electrical properties can be easily ascertained.

What is claimed is:

1. A method of forming an ohmic contact to a semiconductor device comprising the steps of depositing a thin film of nickel and chromium onto a surface of said semiconductor;

depositing a thin film of nickel and chromium and silver on top of said nickel and chromium thin film;

depositing a thick film of silver on top of said nickel, chromium and silver thin film so as to form the outermost portion of said contact; and heating the structure formed thereby to that temperature and for that length of time which insures a eutectic bond between the nickel in said nickel and chromium film and the semiconductive material in said device, whereby said contact may be formed at temperatures below 560° C., whereby said contact is ductile enough to follow the contractions and expansions of said semiconductive material and whereby said contact is uniform in electrical characteristics across the surface of said semiconductive material.

2. A method as recited in claim 1 wherein said temperature is between 500° C. and 550° C.

3. A method for metallizing the back of a silicon semiconductor having aluminum contacts deposited on the front side thereof so as to provide said semiconductor with a contact eutectically bonded to said silicon and adapted to receive a weld or solder joint comprising the steps of forming a thin film of nickel and chromium on a portion of said semiconductor;

forming a thin film blend of nickel, chromium and silver on said nickel and chromium film;

forming a thick film of silver over said nickel, chromium and silver film so as to establish a surface adapted to receive a weld or solder joint; and heating the structure formed thereby to a temperature and for a time sufficient to eutectically bond said first mentioned film to said silicon, said temperature being under 560° C.

4. A method for forming an ohmic contact on the back side of a silicon wafer comprising the steps of abrading said back side so as to form an evenly roughened surface;

cleaning said roughened surface so as to remove all of the loose material formed by said abrading step and all other substances except the silicon and doping impurities;

depositing a thin film of nickel and chromium on said cleaned surface;

depositing a thin film of nickel, chromium and silver on top of said nickel and chromium film;

forming a layer of silver over said nickel, chromium and silver film; and heating the structure formed thereby until a eutectic bond is formed between said silicon and the nickel and chromium film.

5. The method as recited in claim 4 wherein said thin films have a thickness from 500 to 1,000 angstroms and wherein said thick film has a thickness between 1 and 4 microns.

References Cited

UNITED STATES PATENTS

| | | | |
|---|---|---|---|
| 2,916,806 | 12/1959 | Pudvin | 29—590 |
| 3,241,931 | 3/1966 | Triggs et al. | 317—234 M |
| 3,266,127 | 8/1966 | Harding et al. | 29—589 UX |
| 3,429,029 | 2/1969 | Langdon et al. | 29—589 |
| 3,436,614 | 4/1969 | Nagatsu et al. | 317—234 M |
| 3,479,736 | 11/1969 | Toki et al. | 29—577 |

J. SPENCER OVERHOLSER, Primary Examiner

R. J. SHORE, Assistant Examiner

U.S. Cl. X.R.

29—590; 111—217; 317—234